(12) United States Patent
Easwaran et al.

(10) Patent No.: US 10,520,971 B2
(45) Date of Patent: Dec. 31, 2019

(54) CURRENT SINK WITH NEGATIVE VOLTAGE TOLERANCE

(71) Applicant: Texas Instruments Incorporated, Dallas, TX (US)

(72) Inventors: Sri Navaneethakrishnan Easwaran, Plano, TX (US); Vijayalakshmi Devarajan, Plano, TX (US); Timothy Paul Duryea, Plano, TX (US); Shanmuganand Chellamuthu, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/832,071

(22) Filed: Dec. 5, 2017

(65) Prior Publication Data

US 2019/0025866 A1    Jan. 24, 2019

Related U.S. Application Data

(60) Provisional application No. 62/533,864, filed on Jul. 18, 2017.

(51) Int. Cl.
    *G05F 3/26* (2006.01)
    *B60T 8/172* (2006.01)
    *B60T 8/1761* (2006.01)
    *H03K 17/687* (2006.01)

(52) U.S. Cl.
    CPC .............. *G05F 3/262* (2013.01); *B60T 8/172* (2013.01); *B60T 8/17613* (2013.01); *H03K 17/687* (2013.01)

(58) Field of Classification Search
    None
    See application file for complete search history.

(56) References Cited

U.S. PATENT DOCUMENTS

| | | | |
|---|---|---|---|
| 5,548,240 A * | 8/1996 | Bayer | H03K 17/163 |
| | | | 326/27 |
| 5,789,951 A | 8/1998 | Shen | |
| 6,577,171 B1 * | 6/2003 | Filippo | H03K 17/04123 |
| | | | 327/108 |

(Continued)

OTHER PUBLICATIONS

International Search Report dated Nov. 15, 2018.

*Primary Examiner* — Jeffery S Zweizig
(74) *Attorney, Agent, or Firm* — Lawrence J. Bassuk; Charles A. Brill; Frank D. Cimino

(57) ABSTRACT

A current sink circuit coupled to pull down a gate control node (GCN) for an NMOS power FET that controls an actuator includes first and second NMOS transistors coupled in series between the GCN and a lower rail, where the first NMOS transistor has a gate and drain coupled together through a resistor. The current sink circuit also includes a control signal generation circuit (CSGC) and a negative voltage blocking circuit (NVBC). The CSGC is coupled to receive at least one voltage input and an ignition signal and to provide a first control signal and a second control signal. The NVBC is coupled to pass the first control signal from the control signal generation circuit to the gate of the first NMOS transistor and to block a negative voltage on the GCN from reaching the CSGC. The second control signal is coupled to the gate of the second NMOS transistor.

14 Claims, 5 Drawing Sheets

(56) References Cited

U.S. PATENT DOCUMENTS

| | | |
|---|---|---|
| 6,734,704 B1 | 5/2004 | Burkland |
| 7,768,323 B2 | 8/2010 | Agneray |
| 8,258,822 B2 * | 9/2012 | Tumminaro ......... H03K 17/163 |
| | | 327/108 |
| 2002/0093372 A1 | 7/2002 | Theobald |

* cited by examiner

CURRENT SINK WITH NEGATIVE VOLTAGE TOLERANCE

FIELD OF THE DISCLOSURE

Disclosed embodiments relate generally to the field of current sinks. More particularly, and not by way of any limitation, the present disclosure is directed to a current sink with negative voltage tolerance.

BACKGROUND

In some safety critical situations such as automotive braking applications, it is necessary that an actuator not be turned ON inadvertently. This means that the actuator must turn ON only when software initiates a turn ON condition and must remain OFF in all other conditions. When the actuator is controlled by an N-type metal oxide silicon (NMOS) power field effect transistor (FET) serving as the relay driver, the OFF condition should be ensured by a strong gate pull down current. To operate effectively and economically, the pull down current should be active under any phase of operation, have a low overall quiescent current and be able to operate in a harsh automotive environment that includes fast battery transients and inductive switching that can result in voltage levels of 40V and −25V.

SUMMARY

Disclosed embodiments provide a circuit that provides a strong gate pull down current using multiple voltage inputs while protecting the circuit from both high and low transient voltages. A voltage to drive the pull down circuit can be drawn from the drains of one or more control NMOS power FETs, other sources tied to the battery or to additional voltages available when the ignition is ON. Elements of the circuit are protected from high voltages as well as negative voltages.

In one aspect, an embodiment of a current sink circuit coupled to pull down a gate control node for an N-type metal oxide (NMOS) power field effect transistor (FET) that controls an actuator is disclosed. The current sink circuit includes a first NMOS transistor coupled in series with a second NMOS transistor between the gate control node and a lower rail, the first NMOS transistor having a respective gate and drain coupled together through a first resistor; a control signal generation circuit coupled to receive at least one voltage input and an ignition signal and further coupled to provide a first control signal and a second control signal, the second control signal being coupled to the gate of the second NMOS transistor; and a negative voltage blocking circuit coupled to pass the first control signal from the control signal generation circuit to the gate of the first NMOS transistor and to block a negative voltage on the gate control node from reaching the control signal generation circuit.

In another aspect, an embodiment of a system-on-chip (SOC) is disclosed. The SOC includes a power supply module coupled to a connector for coupling to a battery; a plurality of transceivers coupled to the power supply modules; a plurality of valve drivers coupled to respective connectors for connection to a respective actuator; a plurality of current sink circuits coupled to pull down a gate control node for a respective N-type metal oxide (NMOS) power field effect transistor (FET) that switches a respective valve driver of the plurality of valve drivers and a respective actuator coupled thereto, a current sink circuit of the plurality of current sink circuits comprising: a first NMOS transistor coupled in series with a second NMOS transistor between the gate control node and a lower rail, the first NMOS transistor having a respective gate and drain coupled together through a first resistor; a control signal generation circuit coupled to receive at least one voltage input and an ignition signal and further coupled to provide a first control signal and a second control signal, the second control signal being coupled to the gate of the second NMOS transistor; and a negative voltage blocking circuit coupled to pass the first control signal from the control signal generation circuit to the gate of the first NMOS transistor and to block a negative voltage on the gate control node from reaching the control signal generation circuit.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1:
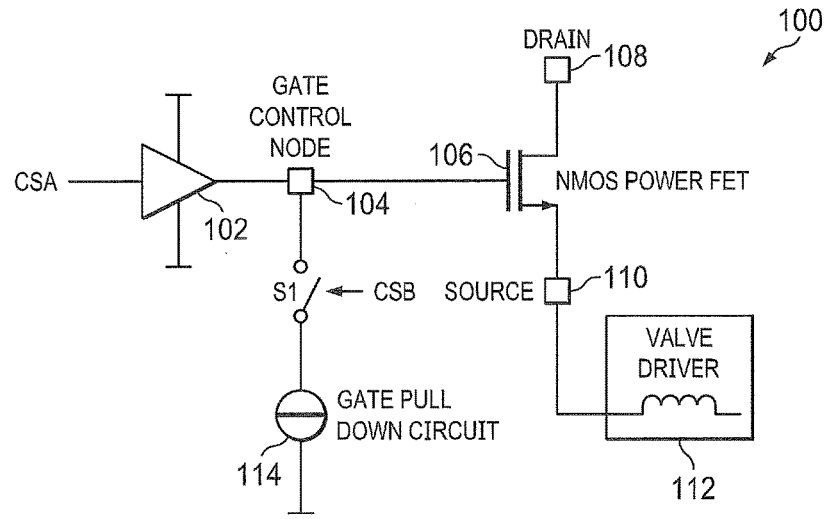
FIG. 1 depicts an example of a braking actuator in which a current sink according to an embodiment of the disclosure can be utilized.

FIG. 1 depicts an example of a schematic for an actuator control system 100 for an automotive application in which a current sink according to the present disclosure can be utilized. Actuator control system 100 includes an NMOS power FET 106 that controls a current between drain 108 and source 110. Source 110 is coupled to valve driver 112 that controls specific valves in the vehicle to effect, e.g., braking. A control signal CSA is provided to driver 102, which in turn is coupled to provide a control signal on gate control node (GCN) 104 to turn NMOS power FET 106 ON and OFF. As previously mentioned, it is critical that NMOS power FET 106 not turn ON unless driven to turn ON by driver 102. In order to avoid inadvertently turning ON NMOS power FET 106, a gate pull-down circuit 114 is selectively coupled between gate control node 104 and the lower rail by a switch S1 that is controlled by control signal CSB. In one embodiment, control signals CSA and CSB have opposite logic values. That is, when control signal CSA is high, NMOS power FET 106 is turned ON, control signal CSB is low and opens switch S1. When control signal CSA is low, control signal CSB is high and closes switch S1, pulling down gate control node 104. Gate pull-down circuit 114 needs to be active under any phase of operation, yet maintain a low quiescent current from the battery. Gate pull-down circuit 114 must be able to handle fast battery transients and inductive switching and the resulting voltage levels of 40V to −25V.

Figure 2:
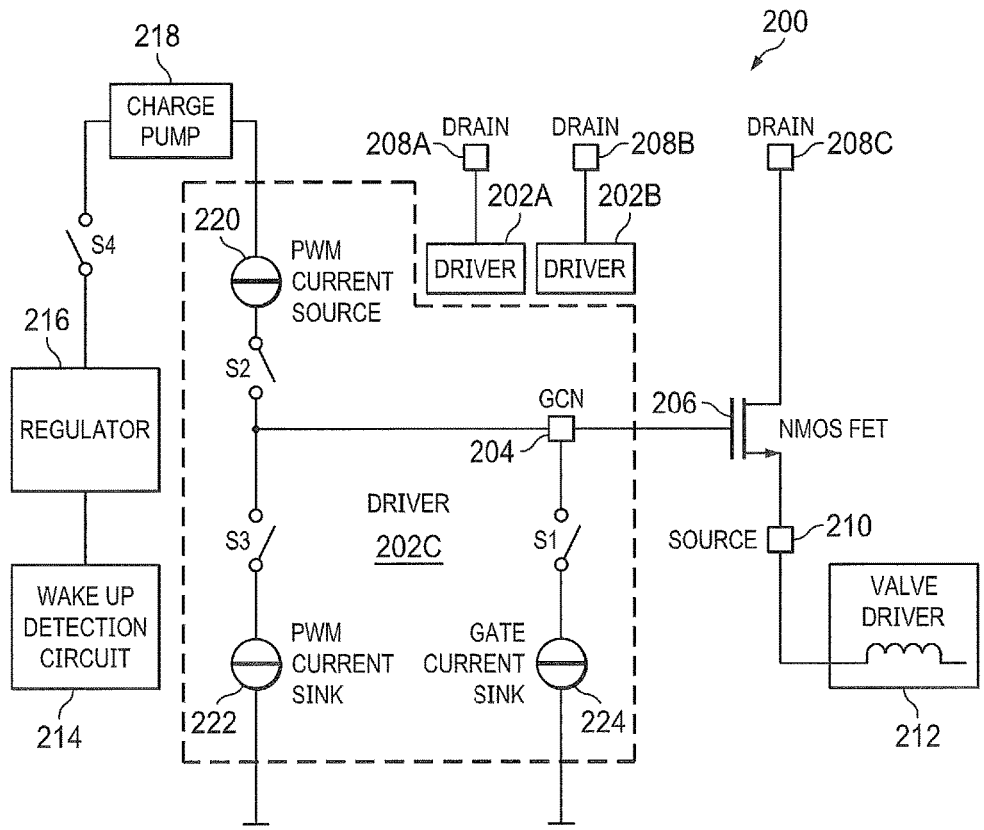
FIG. 2 depicts further details of an example braking actuator in order to describe some of the issues that need to be overcome.

FIG. 2 provides a schematic of an example actuator control system 200 that provides somewhat greater detail in order to discuss some of the needs of the specific application. Actuator control system 200 includes NMOS power FET 206, which is coupled to gate control node GCN 204, drain 208C and source 210. NMOS power FET 206, when turned ON, will supply power to valve driver 212. In this embodiment, NMOS power FET 206 is one of three switches that are each tied to a separate valve driver, although the other two NMOS power FETs are not shown and are represented only by their respective drains 208A, 208B. Each of NMOS power FET 206 and the NMOS power FETs represented by drains 208A, 208B are coupled to be driven by respective drivers 202A, 202B, 202C; greater detail is shown only for driver 202C.

Within driver 202C, pulse width modulation (PWM) current source 220 sources current to gate control node 204 when switch S2 is closed and PWM current sink 222 sinks current from gate control node 204 when switch S3 is closed. PWM current source 220 and PWM current sink 222 are active to control NMOS power FET 206 when the ignition for the vehicle is turned ON. When the ignition is OFF, switch S1 is closed and gate current sink 224 sinks current from GCN 204.

When a user with an electronic key is near the vehicle, wake-up detection circuit 214 enables several functions in the vehicle; these functions in turn provide an ultra-low current output The ultra-low current is provided to a regulator 216, which also acts as a bias generator. The wake-up detection circuit 214 and regulator 216 are selectively coupled to charge pump 218 through switch S4. Charge pump 218 is further coupled to driver 202 to provide a voltage to PWM current source 220.

It is desirable to have gate current sink 224 be activated from GCN 204 when any of the following conditions is true: a) pulse width modulation is OFF; b) the ignition is OFF; c) battery power is supplied; or d) any combinations of drains 208 carries a minimum of 3 volts. In one embodiment, the following conditions are desirable:

The pull down current through NMOS power FET 206 is greater than 7 mA when the voltage on the combination of drains 208 is between 3 and 40 volts and GCN 204 has a low value, e.g., 0.5 volts;

The pull-down current is less than 400 mA when the voltage on the combination of drains 208 is between 3 and 40 volts and GCN 204 has a high value, e.g., 20 volts;

The sum of currents through drains 208 is less than 5 µA at 14 volts input;

Negative voltages on GCN 204 are blocked up to −25 volts; and

The pull down current is OFF when the ignition is ON.

Figure 6:
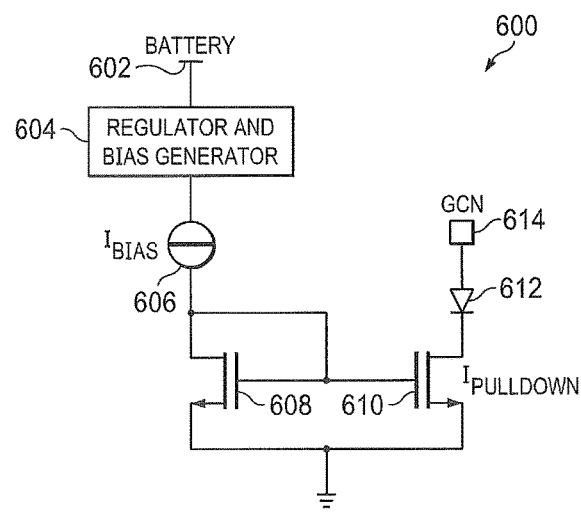
FIG. 6 depicts an implementation of a current sink according to the prior art.

FIG. 6 depicts an example of a current sink 600 according to the prior art. In current sink 600, regulator and bias generator 604 is coupled to battery 602 and to current source $I_{BIAS}$ 606, which sources a current to the drain of NMOS transistor 608. NMOS transistor 608 has a source coupled to the lower rail, a gate and drain coupled together, and forms a current mirror with NMOS transistor 610, which is coupled between gate control node 614 and the lower rail. NMOS transistor 610 sinks current from gate control node 614, with diode 612 ensuring that current does not flow out of current sink 600, even if GCN 614 has a negative voltage.

Current sink 600 has several issues. First, the current sink $I_{PULLDWN}$ does not sink any current when GCN 614 is equal to 0.5 volts because diode 612 typically requires at least 0.7 volts to pass a current. Additionally, the bias current $I_{BIAS}$ is zero if battery power is not available, even when a voltage exists on one or more of the drains for the actuators. If regulator and bias generator 604 is supplied by battery power and by the drains, then the sum of currents through drains 208 can exceed the desired 5 µA.

Figure 7:
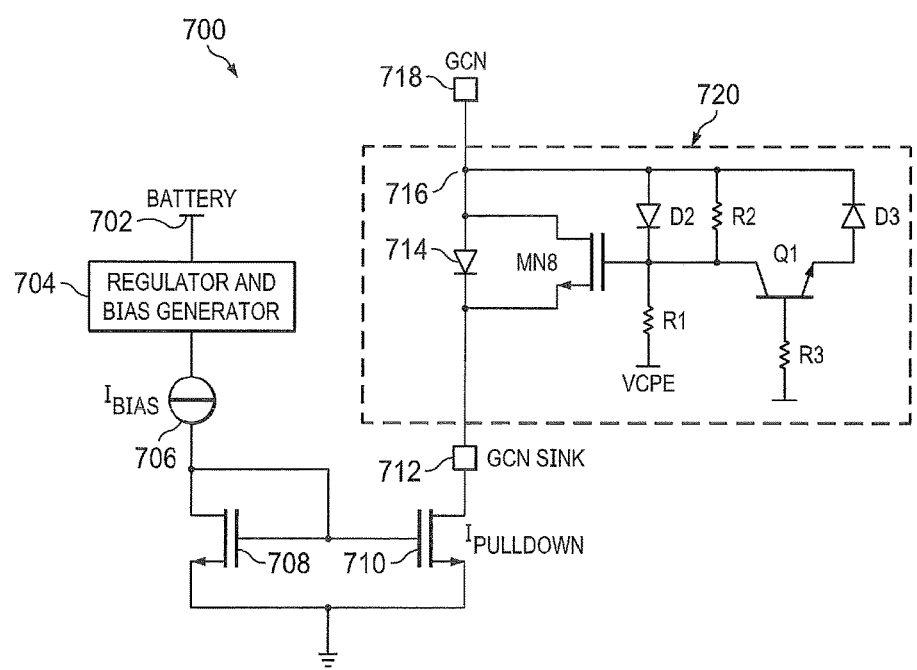
FIG. 7 depicts a further implementation of a current sink according to the prior art

FIG. 7 depicts an example of a prior art current sink 700 for use in the actuator of FIG. 1. Again, regulator and bias generator 704 is coupled to battery 702 and to current source IBIAS 706, while NMOS transistors 708 and 710 form a current mirror. Circuit 720 has been added between node GCN 718 and a new GCN sink node 712, which is coupled to the drain of NMOS transistor 710. Circuit 720 contains NMOS transistor MN8, which is coupled between GCN 718 and GCN sink node 712 and contains diode 714. The gate of NMOS transistor MN8 is coupled to the drain of NPN transistor Q1 and the source of NPN transistor Q1 is coupled through diode D3 to a node 716 that lies between GCN 718 and diode 714. The drain of NPN transistor Q1 is coupled to node 716 through resistor R2. Diode D2 is coupled between node 716 and the gate of NMOS transistor MN8 and also to voltage VCPE through resistor R1. The gate of NPN transistor Q1 is coupled to the lower rail through resistor R3. Circuit 720 is an external circuit; when this solution is integrated into a chip, the diodes cannot be added to NMOS transistor MN8, since these diodes are created from on chip NPN transistors prohibiting −25V operation. It is additionally not possible to ensure that the gate/source voltage of NMOS transistor MN8 is limited to a maximum value of 5.5 volts, which is the maximum the technology allows. Hence, it is not possible to incorporate this circuit into a system-on chip or similar type chip.

Figure 3:
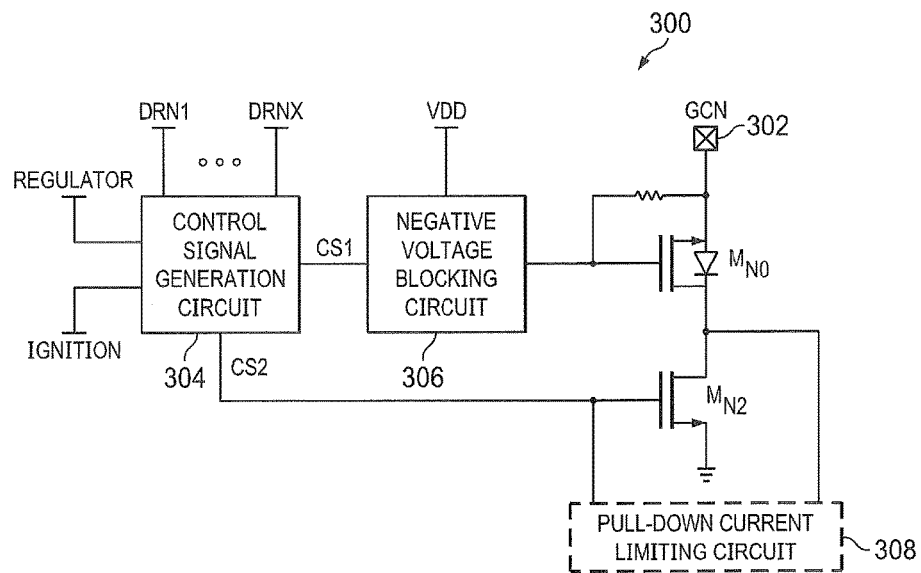
FIG. 3 depicts high level schematic of a current sink according to an embodiment of the disclosure.

FIG. 3 depicts a high level schematic of a current sink 300 according to an embodiment of the disclosure. Current sink 300 can be implemented, for example, to provide gate pull-down circuit 114 and control signal CSB. Current sink 300 includes two NMOS transistors MN0 and MN2 that are coupled to pull down gate control node 302 when both of NMOS transistors MN0 and MN2 are turned ON. Control signal generation circuit 304 is coupled to receive power from a number of voltage inputs, which can include, for example, one or more drains, e.g., DRN1 through DRNX, of power FETs for driving control valves as well as input from a regulator, such as regulator 216. Applicant notes that except for the drain of the NMOS power FET that is controlled by gate control node 302, all of these voltage inputs are optional, although their inclusion may be desirable in at least some applications. An ignition signal, IGNITION, is also received to enable the detection of when the ignition is ON. Control signal generation circuit 304 provides two control signals. Control signal CS1 is provided to the gate of NMOS transistor MN0 and control signal CS2 is provided to the gate of NMOS transistor MN2.

Because the gate and drain of NMOS transistor MN0 are coupled together, NMOS transistor MN0 acts as a diode when gate control node 302 becomes negative, e.g., due to inductive switching or a battery coupled in reverse, and will block a reverse current through NMOS transistors MN0, MN2. However, the negative voltage must also not be allowed to pull current from control signal generation circuit 304. Negative voltage blocking circuit 306 is coupled between control signal generation circuit 304 and the gate of NMOS transistor MN0 to block the effect of a negative voltage on gate control node 302 from reaching control signal generation circuit 304. When gate control node 302 has a positive voltage, negative voltage blocking circuit 306 will pass the control signal CS1 through to the gate of NMOS transistor MN0, but will block the effect of a negative voltage on gate control node 302. Negative voltage blocking circuit 306 can receive other signals that help to determine when the current should be blocked, e.g., negative voltage blocking circuit 306 can receive the value of gate control node 302, control signal CS2, a supply voltage such as VDD, the ignition signal IGNITION and a reference signal (not specifically shown).

Additionally, in many instances, it is desirable to limit the amount of pull-down current that is drawn off of gate control node 302 when the voltage on gate control node 302 is high, e.g., 14 volts. When limiting the pull-down current is desired, pull-down current limiting circuit 308 can be coupled to the current through NMOS transistors MN0, MN2 and to the gate of NMOS transistor MN2 to limit the current as desired.

Figure 4:
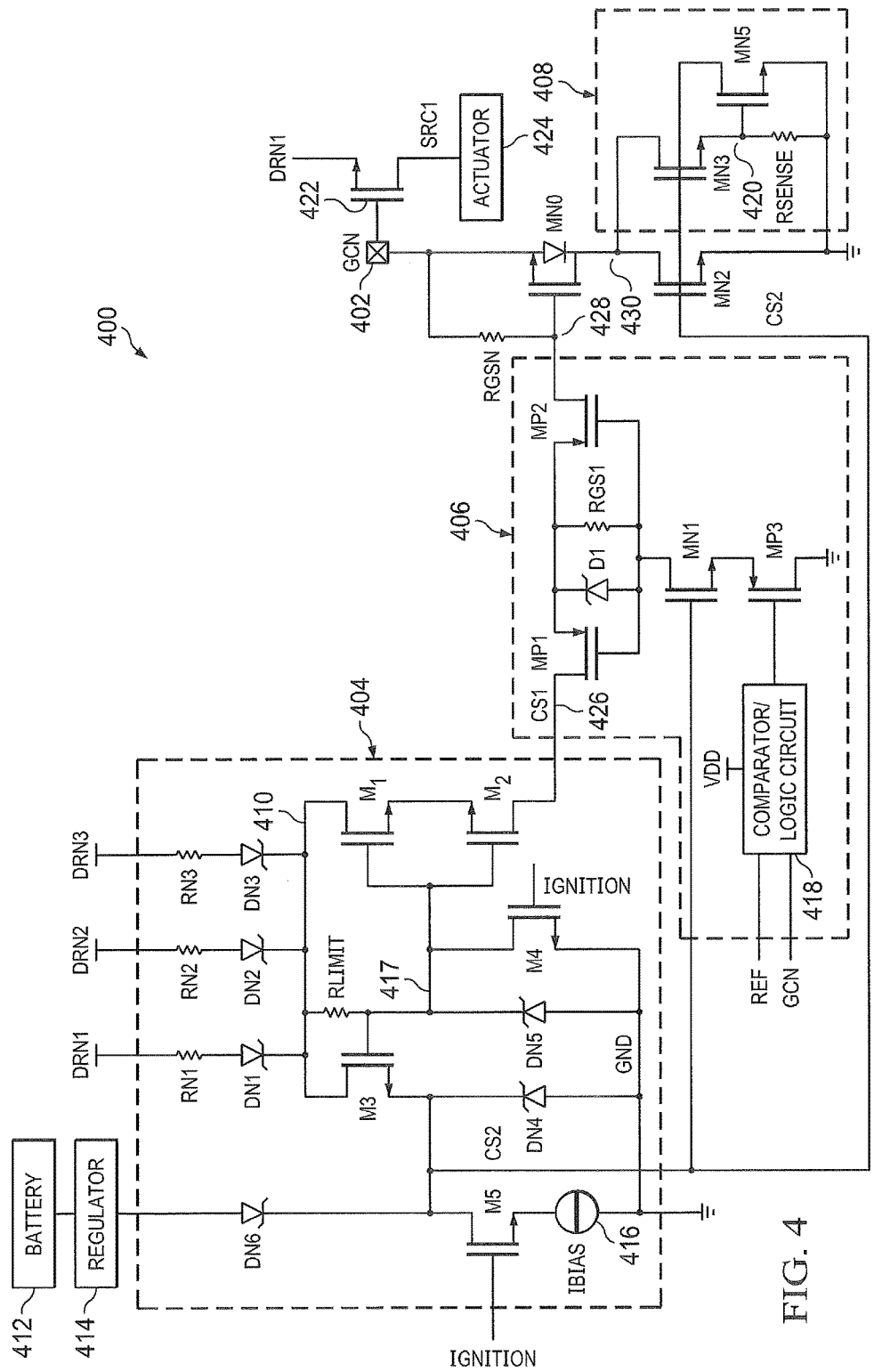
FIG. 4 depicts an implementation of a current sink circuit according to an embodiment of the disclosure.

Turning next to FIG. 4, a specific embodiment of system 400 is shown in which a current sink circuit according to an embodiment of the disclosure is utilized. System 400 includes an NMOS power FET 422 having a drain DRN1 and a source SRC1 that is coupled to control actuator 424. The gate of NMOS power FET 422 is coupled to gate control node 402, to which the current sink circuit is coupled. The system also includes battery 412 and regulator 414. The current sink circuit includes NMOS transistors MN0 and MN2, which are coupled in series between gate control node 402 and the lower rail. In at least one embodiment, the lower rail is ground. Similar to current sink 300, NMOS transistor MN0 has a respective gate and source coupled together through resistor RGSN so that NMOS transistor MN0 acts as a diode when the voltage on gate control node 402 is negative. NMOS transistor MN0 receives control signal CS1 on a respective gate and NMOS transistor MN2 receives control signal CS2 on a respective gate. Three additional circuits are part of the current sink circuit: control signal generation circuit 404 provides control signals CS1, CS2, negative voltage blocking circuit 406 blocks a negative voltage on gate control node 402 from pulling current from control signal generation circuit 404, and pull-down current limiting circuit 408 restricts the amount of current that is pulled out of gate control node 402 when the voltage on gate control node 402 is high. The individual circuits and their operation will now be explained.

In this example embodiment, control signal generation circuit 404 is coupled to the drains DRN1, DRN2 DRN3 of three separate NMOS power FETs and can receive a voltage from any of these that are powered, i.e., a voltage can be received from any combination of DRN1, DRN2, DRN3. Under some conditions, a voltage can also be received from regulator 414. The input from regulator 414 is optional and is necessary only when no voltage is present on the drains but the ignition is OFF. In one embodiment, regulator 414 provides a voltage of 3.6 volts. Each of drains DRN1, DRN2, DRN3, as well as regulator 414, are tied to battery 412 and accordingly can experience the voltage swings that are inherent in many automotive circuits. Each of drains DRN1, DRN2, DRN3 is coupled to provide input to control signal generation circuit 404 through a respective resistor RN1, RN2, RN3 and a respective Zener diode DN1, DN2, DN3. The voltages received from drains DRN1, DRN2 DRN3 are coupled together at a common voltage node 410.

NMOS transistor M3 has a drain that is coupled to common voltage node 410 and a source that is coupled to the lower rail through Zener diode DN4. The source of NMOS transistor M3 is also coupled to provide control signal CS2, which is utilized to control the gate of NMOS transistor MN2. Battery 412 is coupled to regulator 414 and regulator 414 is coupled to the source of NMOS transistor M3 through Zener diode DN6. NMOS transistor M5 also has a drain coupled to the source of NMOS transistor M3 and a source coupled to the lower rail through current sink 416. When the ignition is turned ON, current sink 416 can couple control signal CS2 to ground.

NMOS transistors M1 and M2 are coupled in series between common voltage node 410 and the negative voltage blocking circuit 406 and provide control signal CS1. The gates of NMOS transistors M1, M2 and M3 are controlled in common by gate node 417, which is coupled to the common voltage node through resistor RLIMIT and is also coupled to the lower rail through Zener diode DN5. It is desirable to provide NMOS transistors M1 and M2 in this back-to-back configuration as a protection against a high voltage, e.g. 40 volts, being received on any of drains DRN1, DRN2, DRN3. In this situation, Zener diode DN5 ensures that the voltage on gate node 417 does not exceed 5.5 volts, but this can cause a source/gate voltage of around 35 volts if a single transistor is utilized in this position. By providing NMOS transistors M1 and M2 in the back-to-back configuration shown, the two transistors protect each other, NMOS transistor M4 is also coupled between gate node 417 and the lower rail and is controlled by the ignition signal.

In one embodiment, whenever a voltage on any of drains DRN1, DRN2, DRN3 is at least three volts, control signals CS1 and CS2 will be provided at the outputs of control signal generation circuit 404 and have values of about 1.7 volts. If regulator 414 is also providing a voltage, control signal CS2 can carry a voltage of around 3 volts. If only one or two of the drain DRN1, DRN2, DRN3 are active, Zener diodes DN1, DN2, DN3 prevent a backflow of charge through the input nodes. Zener diode DN6 prevents a similar backflow of charge to the regulator 414.

In one embodiment, the maximum gate/source voltage that can be tolerated by the technology is 5 volts; Zener diode DN5 allows voltages above the limit to flow to ground. Zener diode DN4 provides similar protection on control signal CS2. When the ignition is turned ON, NMOS transistor M4 will draw down the gate node 417 of NMOS transistors M1, M2, M3, turning OFF both of control signals CS1, CS2. NMOS transistor M5 will likewise couple control signal CS2 to ground when the ignition is ON.

Negative voltage blocking circuit 406 includes two P-type metal oxide silicon (PMOS) transistors MP1, MP2, which are coupled in series between control signal generation circuit 404 and the gate of NMOS transistor MN0 and have their gates coupled together. Zener diode D1 and resistor RGS1 are coupled in parallel between the common node between PMOS transistors MP1, MP2 and their common gate node. NMOS transistor MN1 and PMOS transistor MP3 are coupled in series between the common gate node of PMOS transistors MP1, MP2 and the lower rail. The gate of NMOS transistor MN1 is controlled by control signal CS2 and the gate of PMOS transistor MP3 is controlled by comparator/logic circuit 418 that compares the value on the gate control node 402 against zero and turns PMOS transistor MP3 OFF when gate control node 402 is less than zero. Comparator/logic circuit 418 receives power from a voltage source VDD, which in one embodiment is 5 volts.

During operation of the pull-down circuit, NMOS transistor MN1 is ON when power is supplied by the drains DRN1, DRN2, DRN3 and can be supplemented when the regulator is also providing a voltage to the circuit. PMOS transistor MP3 is ON when the voltage on gate control node 402 is greater than or equal to zero, pulling the gates of PMOS transistors MP1, MP2 low to hold these PMOS transistors ON to allow control signal CS1 to pass through without attenuation. However, when the value of gate control node 402 drops below zero, comparator/logic circuit 418 provides a high value on the gate of PMOS transistor MP3, turning OFF this transistor and interrupting the pull-down of the gate nodes of PMOS transistors MP1, MP2 to turn OFF these two transistors. Turning OFF PMOS transistors MP1, MP2 prevents a negative voltage on gate control node 402 from pulling a current from control signal generator circuit 404.

Finally, pull-down current limiting circuit 408 includes two NMOS transistors MN3 and MN5 and sense resistor RSENSE. The drain of NMOS transistor MN3 is coupled to node 430, which lies between the two pull-down NMOS transistors MN0, MN2 and the source of NMOS transistor MN3 is coupled to the lower rail through sense resistor RSENSE. NMOS transistor MN5 is coupled between control signal CS2 and the lower rail and the gate of NMOS transistor MN5 is coupled to sense node 420, which lies between the source of NMOS transistor MN3 and sense resistor RSENSE. As the current flowing through pull-down NMOS transistors MN0, MN2 increases, the voltage on sense node 420 also increases and turns ON NMOS transistor MN5. This action draws down the voltage carried on control signal CS2 and serves to limit the current passing through NMOS transistors MN0 and MN2 as a result. In one embodiment, pull-down current limiting circuit 408 limits the current through pull-down NMOS transistors MN0, MN2 to 400 mA.

Given the variability of the voltages appearing on the various drains and on gate control node 402, there are many conditions that have to be protected against in one way or another. Table 1 below summarizes some of these voltage situations to provide an overview of the operation of the disclosed circuit.

TABLE 1

| Condition | Mode of Operation | Signals | MP1/MP2 | MNO mode |
|---|---|---|---|---|
| Gate control node is positive (≥0.5 V) | Standby Ignition OFF | CS1 = 1.8 V, CS2 = 3 V MP3 = 0 V | ON | Switch (at least 10 mA pulldown on Gate control node) |
| Gate control node is positive (≥0.5 V) | DRNx > 3 V Only DRNx voltage available Ignition OFF | CS1 = 1.8 V CS2 = 1.7 V MP3 = 0 V | ON | Switch (at least 10 mA pulldown on Gate control node) |
| Gate control node is negative (−25 V) | Ignition ON (VDD = 5V) | CS2 = 0 V MP3 (GATE) = 3 V | OFF | Diode |

As mentioned previously, it is desired that by the time the gate control node 402 reaches 0.5 volts, the current sink should be turned on to pull the gate control node towards ground whenever the ignition is OFF. This situation is seen in both the first and second entries of Table 1, where gate control node 402 is greater than or equal to 0.5 volts and the ignition is OFF. In both of these entries, the drains or common voltage node 410 is about 3 volts, while the difference between these two entries is whether or not any voltage is available from regulator 414. In the first entry, a voltage from the regulator of about 3.6 volts is available. Control signal CS1 has a voltage of about 1.8 V, which is sufficient to turn ON NMOS transistor MN0. Control signal CS2, because of the additional voltage from regulator 414, has a value of about 3 V, which turns ON the gate of NMOS transistor MN2, so that a current of 10 mA flows through NMOS transistors NM0, NM2, and also turns ON NMOS transistor MN1 to ensure that the gates of PMOS transistors MP1, MP2 are pulled down.

In the second entry, voltage from regulator 414 is not available, so only the drains determine the value of control signal CS2. In this situation, control signal CS1 remains at about 1.8 V and control signal CS1 is about 1.7 V, which is still sufficient to turn ON NMOS transistor MN2 and MN1 to pull down the gates of PMOS transistors MP1, MP2.

In both of these situations, the voltage on node 426 is equal to the voltage on gate node 417 minus the threshold voltage of NMOS transistor M1 and this voltage is passed through PMOS transistors MP1, MP2 to node 428. If the gate control node 402 goes up to 40 V, whether the voltage on common voltage node 410 is 4 V or 40 V, the current through NMOS transistor MN2 is limited by the pull-down current limiting circuit 408 and will not exceed 400 mA in one embodiment. More generally speaking, when the voltage on the common voltage node 410 is greater than the voltage on GCN 402, node 426 is limited to the voltage on gate node 417 minus the threshold voltage of NMOS transistor M1 and when GCN 402 has a higher voltage than the common voltage node 410, node 426 tracks node 428 as long as GCN 402 has a positive voltage.

If gate control node 402 is negative, as shown in the third entry in Table 1, node 428 will track GCN 402. However, the negative voltage on GCN 402 causes comparator/logic circuit 418 to turn OFF PMOS transistor MP3, which in turn turns OFF PMOS transistors MP1, MP2, so node 426 is not disturbed by the negative voltage. In the special condition where the battery is accidently connected in reverse, the ignition will be OFF and both GCN 402 and the drains DRN1, DRN2, DRN3 are negative. PMOS transistor MP3 and NMOS transistor MN1 are OFF, which causes PMOS transistors MP1, MP2 to turn OFF. Node 428 tracks GCN 402 and prevents current flow from the substrate to GCN 402. If the ignition is ON and GCN is negative while the drain is positive, comparator/logic circuit 418 turns PMOS transistor MP3 OFF to turn OFF PMOS transistors MP1, MP2. Node 428 again tracks GCN 402 and prevents any current flow from the substrate to GCN 402.

Figure 5:
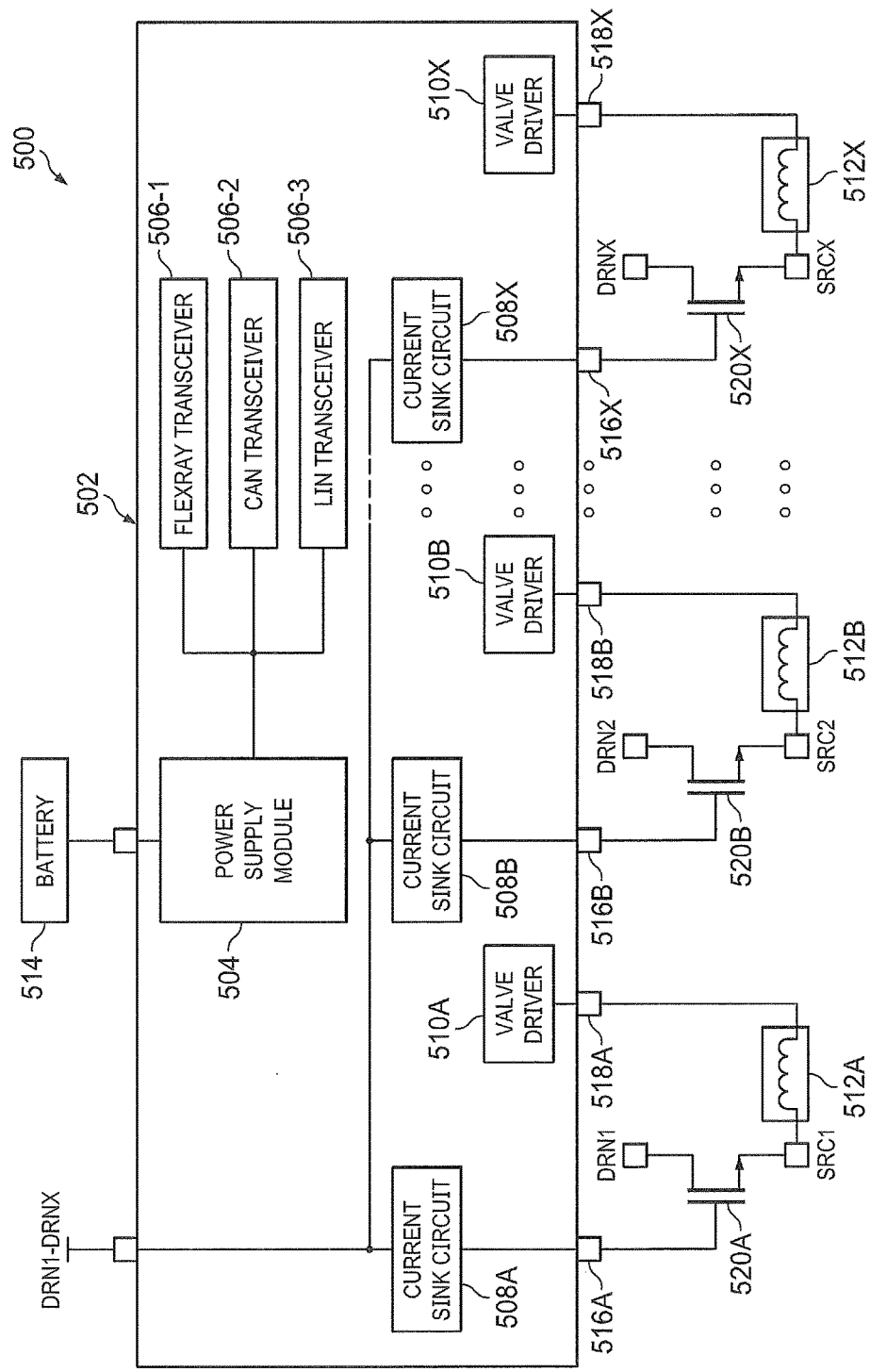
FIG. 5 depicts an example schematic of a portion of an automotive system in which a chip containing the disclosed current sink operates according to an embodiment of the disclosure.

FIG. 5 depicts an example schematic of a portion of an automotive system 500 in which a chip 502 containing the disclosed current sink operates according to an embodiment of the disclosure. In this embodiment, automotive system 500 includes a battery 514 supplying power to chip 502 and actuators 512 that are controlled by chip 502. Chip 502 is a system-on-chip that will be utilized to electronically control multiple systems, e.g., windows, door locks, braking systems, etc., at least some of which are considered safety critical. Chip 502 contains a power supply module 504 that is coupled to the battery through an external contact, which can be a lead that is part of a leadframe, a bump in a bump array or any other type of external connector.

A number of transceivers 506 are coupled to receive power from power supply module and to provide communications across various bus systems throughout the automotive environment. In the embodiment shown, transceiver 506-1 is for FlexRay, which is a bus system for security-critical applications. Transceiver 506-2 is for the Controller Area Network (CAN), which enables the networking of a large number of Engine Controller Units (ECUs) that control actuators on an internal combustion engine to ensure optimal engine performance. Transceiver 506-3 is for Local INterconnect (LIN), which enables the integration of sensors and actuators in vehicle networks. It will be understood that other networks can also be utilized within the automotive environment and that their associated transceivers can also be included in chip 502 as necessary or desired.

Chip 502 also contains a number of valve drivers 510 and current sink circuits 508. As shown, the gates of a number of power NMOS FETs 520 can each be coupled to a respective current sink circuit 508 through a connector 516 for the gate control node so that the power NMOS FET is held OFF when the ignition is OFF. The source of each power NMOS FET 520 is coupled to one terminal of an actuator 512 and a second terminal of the actuator 512 is coupled to a respective valve driver 510 through a respective connector 518. Although a single actuator 512 is shown being connected between a respective NMOS FET 520 and a respective valve driver 510, a group of actuators 512 that operate in unison can be coupled between a valve driver 510 and power NMOS FET 520.

Applicants have disclosed a current sink circuit and a chip in which the current sink circuit is utilized to pull down the gate control node of an NMOS power FET to ensure that the power FET does not turn ON inadvertently. Applicants have shown that the current sink circuit operates to provide the desired pull-down current whenever a voltage of at least 0.5 volts is present on the gate control node. The current sink circuit can operate properly with voltages that range from −25 volts to 40 volts in line with the harsh automotive environment in which they will operate.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A circuit comprising:
    (a) a gate control node and a lower rail;
    (b) a first transistor having a first drain, a first gate, and a first source, the first source being coupled to the gate control node;
    (c) a second transistor having a second drain, a second gate, and a second source, the second drain being coupled to the first drain and the second source being coupled to the lower rail;
    (d) a first resistor coupled between the first source and the first gate;
    (e) control signal generation circuitry having an ignition input, a first power transistor drain input, a first control signal output, and a second control signal output, the second control signal output being coupled to the second gate; and
    (f) a negative voltage blocking circuit having a first control signal input coupled to the first control signal output and having a negative blocked control signal output coupled to the first gate.

2. The circuit of claim 1 in which the first and second transistors are NMOS transistors.

3. The circuit of claim 1 in which the control signal generation circuit includes:
    a second resistor and a first Zener diode coupled in series to the first power transistor drain input;
    a common voltage node that is coupled to the first power transistor drain input through the second resistor and the first Zener diode;
    a second Zener diode;
    a third transistor having a third drain coupled to the common voltage node, a third gate, and a third source, the third source being coupled to the lower rail through the second Zener diode, a node between the source of the third transistor and the second Zener diode being coupled to the second control signal output;
    a fourth transistor and a fifth transistor coupled in series between the common voltage node and the first control signal output;
    a gate node coupled to the gates of the third, fourth and fifth transistors;
    a third resistor coupled between the gate node and the common voltage node;
    a third Zener diode coupled between the gate node and the lower rail; and
    a sixth transistor having a sixth drain, a sixth gate, and a sixth source, the sixth transistor coupled between the gate node and the lower rail, the sixth gate being coupled to the ignition input.

4. The circuit of claim 3 in which the first, second, third, fourth, fifth, and sixth transistors are NMOS transistors.

5. The circuit of claim 1 in which the control signal generation circuitry includes a second power transistor drain input.

6. The circuit of claim 1 in which the negative voltage blocking circuit includes:
   a third transistor with a third drain, a third gate, and a third source, the third drain being coupled to the first control signal input;
   a fourth transistor with a fourth drain, a fourth gate, and a fourth source, the fourth source being coupled to the third source, the fourth drain being coupled to the negative blocked control signal output, and the third and fourth gates being coupled together.

7. The circuit of claim 1 including a pull-down current limiting circuit having a second control signal input coupled to the second gate and an input coupled to the first and second drains.

8. The circuit of claim 7 in which the pull-down current limiting circuit includes:
   a third transistor having a drain coupled to the first and second drains, a gate coupled to the second control signal input and a source coupled to the lower rail through a sense resistor; and
   a fourth transistor having a drain coupled to the second control signal input, a source coupled to the lower rail, and a gate coupled between the third transistor and the sense resistor.

9. A system comprising:
   (a) a battery connector, a lower rail connection, and a valve driver output;
   (b) a power transistor having a power drain, a power gate, and a power source, the power gate being coupled to a gate control node and the power source being coupled to the valve driver output;
   (c) a first transistor having a first drain, a first gate, and a first source, the first source being coupled to the gate control node;
   (d) a second transistor having a second drain, a second gate, and a second source, the second drain being coupled to the first drain and the second source being coupled to the lower rail;
   (e) a first resistor coupled between the first source and the first gate;
   (f) control signal generation circuitry having an ignition input, a first power transistor drain input, a first control signal output, and a second control signal output, the second control signal output being coupled to the second gate;
   (g) a negative voltage blocking circuit having a first control signal input coupled to the first control signal output and having a negative blocked control signal output coupled to the first gate; and
   (h) a pull-down current limiting circuit having a second control signal input coupled to the second gate and an input coupled to the first and second drains.

10. The circuit of claim 9 in which the pull-down current limiting circuit includes:
    a third transistor having a drain coupled to the first and second drains, a gate coupled to the second control signal input and a source coupled to the lower rail through a sense resistor; and
    a fourth transistor having a drain coupled to the second control signal input, a source coupled to the lower rail, and a gate coupled between the third transistor and the sense resistor.

11. The circuit of claim 9 in which the control signal generation circuit includes:
    a second resistor and a first Zener diode coupled in series to the first power transistor drain input;
    a common voltage node that is coupled to the first power transistor drain input through the second resistor and the first Zener diode;
    a second Zener diode;
    a third transistor having a third drain coupled to the common voltage node, a third gate, and a third source, the third source being coupled to the lower rail through the second Zener diode, a node between the source of the third transistor and the second Zener diode being coupled to the second control signal output;
    a fourth transistor and a fifth transistor coupled in series between the common voltage node and the first control signal output;
    a gate node coupled to the gates of the third, fourth and fifth transistors;
    a third resistor coupled between the gate node and the common voltage node;
    a third Zener diode coupled between the gate node and the lower rail; and
    a sixth transistor having a sixth drain, a sixth gate, and a sixth source, the sixth transistor coupled between the gate node and the lower rail, the sixth gate being coupled to the ignition input.

12. The circuit of claim 11 in which the power, first, second, third, fourth, fifth, and sixth transistors are NMOS transistors.

13. The circuit of claim 9 in which the negative voltage blocking circuit includes:
    a third transistor with a third drain, a third gate, and a third source, the third drain being coupled to the first control signal input;
    a fourth transistor with a fourth drain, a fourth gate, and a fourth source, the fourth source being coupled to the third source, the fourth drain being coupled to the negative blocked control signal output, and the third and fourth gates being coupled together.

14. The circuit of claim 13 in which the third and fourth transistors are PMOS transistors.

* * * * *